United States Patent
Yu et al.

(10) Patent No.: US 10,296,699 B1
(45) Date of Patent: May 21, 2019

(54) IMPLEMENTING CIRCUIT DESIGNS ADAPTED FOR PARTIAL RECONFIGURATION

(71) Applicant: Xilinx, Inc., San Jose, CA (US)

(72) Inventors: Hao Yu, Longmont, CO (US);
Raymond Kong, San Jose, CA (US);
Jun Liu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/468,021

(22) Filed: Mar. 23, 2017

(51) Int. Cl.
*G06F 17/50* (2006.01)

(52) U.S. Cl.
CPC .................. *G06F 17/5077* (2013.01)

(58) Field of Classification Search
CPC .................................................. G06F 17/5077
USPC ........................................................ 716/131
See application file for complete search history.

(56) References Cited

U.S. PATENT DOCUMENTS

| | | | | |
|---|---|---|---|---|
| 7,193,438 B1* | 3/2007 | Rohe | ................ | H03K 19/17736 326/101 |
| 7,406,673 B1* | 7/2008 | Patterson | ............ | G06F 17/5054 713/100 |
| 8,065,642 B1* | 11/2011 | Corbett | ................ | G06F 17/5081 716/104 |
| 8,176,212 B1* | 5/2012 | Smith | ................ | G06F 15/7867 710/8 |
| 2009/0113373 A1* | 4/2009 | Fukuda | ................ | G06F 17/5081 716/129 |
| 2010/0283505 A1* | 11/2010 | Koch | ................ | G06F 15/7867 326/41 |

\* cited by examiner

*Primary Examiner* — Suchin Parihar
(74) *Attorney, Agent, or Firm* — Kevin T. Cuenot (57) ABSTRACT

Implementing a circuit design for partial reconfiguration can include routing, using a processor, a net of the circuit design that connects an endpoint within a reconfigurable module with an endpoint within static circuitry external to the reconfigurable module and forming, using the processor, a set of candidate nodes including nodes used to route the net. A node from the set of candidate nodes is determined as the partition pin for partial reconfiguration.

18 Claims, 3 Drawing Sheets

IMPLEMENTING CIRCUIT DESIGNS ADAPTED FOR PARTIAL RECONFIGURATION

FIELD OF THE INVENTION

This disclosure relates to integrated circuits (ICs) and, more particularly, to implementing circuit designs adapted for partial reconfiguration.

BACKGROUND

Partial reconfiguration refers to a process whereby a region of a programmable integrated circuit (IC) is reconfigured during operation to implement changed or entirely different circuits therein while circuitry in other surrounding regions of the programmable IC remains unchanged and continues to operate uninterrupted. When implementing a circuit design that utilizes partial reconfiguration, the interface for a reconfigurable region must be preserved. Though the circuitry implemented within the region changes, each different circuit implemented within the region utilizes the same, e.g., a preserved, interface to the surrounding static circuitry. Using the same interface among the different circuits that may be implemented in the reconfigurable region ensures proper implementation and operation of the circuit design within the programmable IC.

SUMMARY

One or more embodiments are directed to methods of implementing a circuit design for partial reconfiguration. In one aspect, a method can include routing, using a processor, a net of the circuit design that connects an endpoint within a reconfigurable module with an endpoint within static circuitry external to the reconfigurable module, forming, using the processor, a set of candidate nodes including nodes used to route the net, and determining, using the processor, a node from the set of candidate nodes as a partition pin for partial reconfiguration.

One or more embodiments are directed to systems for implementing a circuit design for partial reconfiguration. In one aspect, a system includes a processor configured to initiate executable operations. The executable operations include routing a net of the circuit design that connects an endpoint within a reconfigurable module with an endpoint within static circuitry external to the reconfigurable module, forming a set of candidate nodes including nodes used to route the net, and determining a node from the set of candidate nodes as a partition pin for partial reconfiguration.

One or more embodiments are directed to computer program products for implementing a circuit design for partial reconfiguration. In one aspect, a computer program product includes a computer readable storage medium having program code stored thereon. The program code is executable by a processor to perform operations including routing, using the processor, a net of the circuit design that connects an endpoint within a reconfigurable module with an endpoint within static circuitry external to the reconfigurable module, forming, using the processor, a set of candidate nodes including nodes used to route the net, and determining, using the processor, a node from the set of candidate nodes as a partition pin for partial reconfiguration.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION OF THE DRAWINGS

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to implementing circuit designs for partial reconfiguration. One or more embodiments described within this disclosure relate to determining partition pin(s) for reconfigurable partitions of a circuit design. Partition pins refer to wires of the IC that serve as fixed logical and physical interfaces for reconfigurable partitions. For example, signals exchanged between reconfigurable modules implemented within a reconfigurable partition and static circuitry external to the reconfigurable partition flow through these partition pins.

In conventional electronic design automation (EDA) systems, the placement process (e.g., a placer) selects a particular tile of an IC that is used for purposes of selecting a partition pin. The tile includes circuitry such as programmable circuit resources (e.g., look-up tables, gates, etc.) and wires. The routing process (e.g., a router) chooses a particular wire from a plurality of available wires within the tile selected by the placer to serve as the partition pin. This process can lead to reduced quality of result (QOR) since the router is constrained to selecting a wire within a tile already chosen by the placer. The router is thereby constrained to route the signal crossing the partition boundary through the tile selected by the placer. Since nets of the circuit design are routed subsequent to placement, the placer does not have accurate information relating to timing, routability, and other QOR related attributes of the circuit design necessary for making a decision.

In accordance with the inventive arrangements described within this disclosure, the selection of a tile and partition pin within the tile is performed post routing. For example, subsequent to routing a circuit design that includes a reconfigurable partition, a net crossing between the reconfigurable partition and static circuitry external to the reconfigurable partition may be identified. The tiles through which the net traverses are known. Using selection criteria described herein, a particular wire used to route the net is selected as the partition pin. Since the net is already routed, the wire of the selected tile may be used as the partition pin. By allowing the router to select the tile and wire within the tile used as the partition pin, the router is no longer constrained by decisions made by the placer based upon less accurate information. In consequence, improved QOR is achieved in terms of routability and, thus, timing of the circuit design as implemented within an IC.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
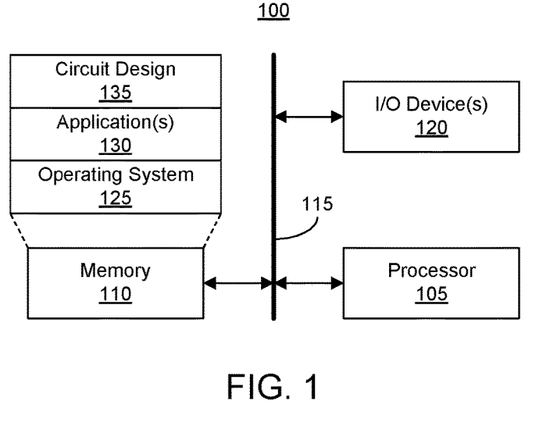
FIG. 1 illustrates an example of a data processing system for use with one or more embodiments described herein.

FIG. 1 illustrates an example of a data processing system (system) 100 for use with one or more embodiments described herein. System 100 includes at least one processor 105, e.g., a central processing unit (CPU). Processor 105 is coupled to memory 110 through interface circuitry 115. System 100 stores computer readable instructions (also referred to as "program code") within memory 110. Memory 110 may be considered an example of computer readable storage media. Processor 105 executes the program code accessed from memory 110 via interface circuitry 115. In an aspect, system 100 is implemented as a computer or other system or device that is suitable for storing and/or executing program code.

Memory 110 includes one or more physical memory devices such as, for example, a local memory and one or more bulk storage devices. The term "local memory" refers to random access memory (RAM) or other non-persistent memory device(s) generally used during actual execution of the program code. The term "bulk storage device" refers to persistent data storage devices such as a hard disk drive (HDD), solid state drive (SSD), etc. System 100 may also include one or more cache memories (not shown) that provide temporary storage of at least some program code in order to reduce the number of times program code must be retrieved from a bulk storage device during execution.

Examples of interface circuitry 115 include, but are not limited to, an input/output (I/O) subsystem, an I/O interface, a bus system, a memory interface, etc. For example, interface circuitry 115 may be one or more of any of several types of bus structures, including a memory bus or memory controller, a peripheral bus, an accelerated graphics port, and a processor or local bus using any of a variety of bus architectures.

System 100 further may include one or more input/output (I/O) devices 120 coupled to interface circuitry 115. I/O devices 120 may be coupled to system 100, e.g., interface circuitry 115, either directly or through intervening I/O controllers. Examples of I/O devices 120 include, but are not limited to, a keyboard, a display device, a pointing device, one or more communication ports, a network adapter, etc. A network adapter refers to circuitry that enables system 100 to become coupled to other systems, computer systems, remote printers, and/or remote storage devices through intervening private or public networks. Modems, cable modems, Ethernet cards, and wireless transceivers are examples of different types of network adapters that may be used with system 100.

Memory 110 stores one or more program modules. The program modules may generally include routines, programs, objects, components, logic, data structures, and so on. For purposes of illustration, memory 110 stores an operating system 125, one or more application(s) 130, and a circuit design 135. In one or more embodiments, application(s) 130 include an EDA application. The EDA application is capable of performing a design flow on circuit design 135 as described herein in greater detail.

In an aspect, operating system 125 and application(s) 130, being implemented in the form of executable program code, are executed by system 100 and, more particularly, by processor 105, to perform the operations described within this disclosure. As such, operating system 125 and application(s) 130 may be considered an integrated part of system 100. Further, it should be appreciated that any data used, generated, and/or operated upon by system 100 (e.g., processor 105) are functional data structures that impart functionality when employed as part of the system.

System 100 may include fewer components than shown or additional components not illustrated in FIG. 1 depending upon the particular type of device and/or system that is implemented. In addition, the particular operating system and/or application(s) included may vary according to device and/or system type as may the types of I/O devices included. Further, one or more of the illustrative components may be incorporated into, or otherwise form a portion of, another component. For example, a processor may include at least some memory.

System 100, in executing application 130, is adapted to operate on circuit design 135. In one or more embodiments, system 100 performs synthesis, placement, and routing on circuit design 135. Subsequent to routing, system 100 identifies nets that cross boundaries of reconfigurable partitions. System 100 is capable of selecting particular tiles and wires within the selected tiles used to route the nets to serve as partition pins for purposes of partial reconfiguration.

Figure 2:
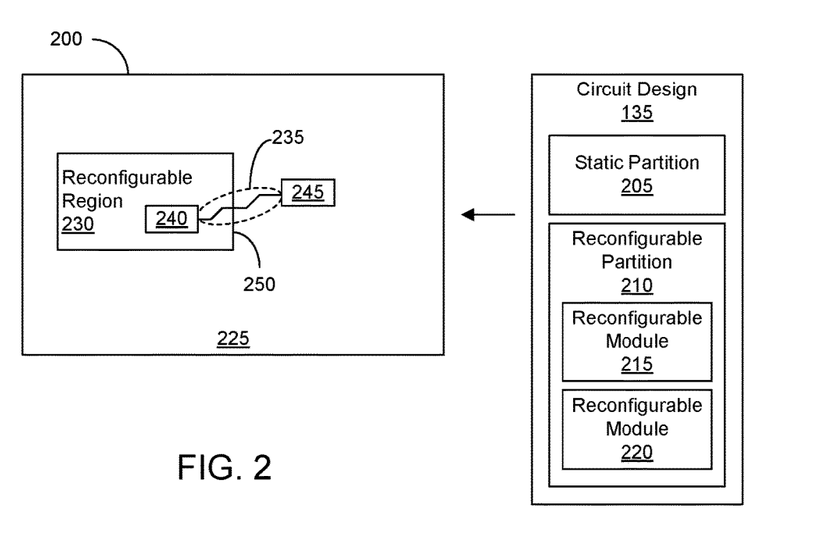
FIG. 2 illustrates an example of a circuit design with a reconfigurable partition and implementation of the circuit design within an integrated circuit.

FIG. 2 illustrates an example of a circuit design with a reconfigurable partition and implementation of the circuit design within an integrated circuit. FIG. 2 illustrates an example of circuit design 135 being implemented within an IC 200.

In an embodiment, circuit design 135 is specified in a hardware description language (HDL) and stored in a data storage device, e.g., memory. System 100 is capable of processing circuit design 135 through a design flow to generate one or more configuration bitstreams (which may include one or more partial bitstreams). The configuration bitstreams may be loaded into IC 200 thereby physically implementing circuit design 135 therein.

In general, circuit design 135 includes two partitions. It should be appreciated that circuit design 135 may include more than two partitions and that the number of partitions used within this disclosure is for purposes of illustration only. The first partition is a static partition 205. In general, static partition 205 refers to the part of circuit design 135 that does not change during partial reconfiguration. Static partition 205, for example, can include the top level and all modules of circuit design 135 not defined as "reconfigurable" or having such an attribute associated therewith. Static partition 205 specifies static circuitry 225 (e.g., static logic and static routing) implemented within IC 200.

The second partition is a reconfigurable partition 210. Reconfigurable partition 210 includes a plurality of reconfigurable modules. In an example, a reconfigurable module refers to the netlist or HDL description that is implemented within a reconfigurable partition. Multiple reconfigurable modules may exist for a given reconfigurable partition. In the example of FIG. 2, reconfigurable partition 210 includes reconfigurable module 215 and reconfigurable module 220. Each of reconfigurable modules 215 and 220 specifies a circuit that is implemented in a reconfigurable region 230 of IC 200, albeit one at a time in alternating fashion.

For example, circuit design 135, as initially implemented in IC 200, may include circuitry of reconfigurable module 215 implemented in reconfigurable region 230. In response to an instruction, an event (e.g., an external event), or some other condition, reconfigurable region 230 is "dynamically" reconfigured to implement the circuitry of reconfigurable module 220. The reconfiguration of reconfigurable region 230 occurs while static circuitry 225 continues to operate uninterrupted. In this manner, the circuitry within reconfigurable region 230 may be changed to implement circuitry of reconfigurable module 215 or circuitry of reconfigurable module 220 as needed during operation of IC 200 without interrupting operation of, or changing, static circuitry 225. Typically, this is accomplished by loading a partial bitstream that reconfigures reconfigurable region 230 to implement circuitry of one module or another while leaving static circuitry 225 unchanged.

For purposes of illustration, reconfigurable module 215 is considered to be, at least initially, implemented in reconfigurable region 230. As shown, reconfigurable module 215 includes a net 235 that has endpoints 240 and 245. Endpoint 240 is part of reconfigurable module 215 and, as such, is located in reconfigurable region 230. Endpoint 245 is located in, and implemented by, static circuitry 225. For purposes of discussion, endpoint 240 may be considered a driver and endpoint 245 considered a load. As illustrated, net 235 crosses a boundary 250 of reconfigurable region 230 (and thus reconfigurable partition 210).

In order to ensure error free operation when switching between reconfigurable module 215 and reconfigurable module 220 within reconfigurable region 230, both modules must utilize the same interface for purposes of communicating with static circuitry 225. For example, a signal of reconfigurable module 220 that crosses boundary 250 to endpoint 245 must pass through a same wire, designated as a partition pin, as a signal of reconfigurable module 215 that also crosses boundary 250 to endpoint 245.

In one or more embodiments, IC 200 is a programmable IC. An example of a programmable IC is a field programmable gate array (FPGA) that includes an array of tiles, where each tile is formed of programmable circuitry. Examples of tiles include, but are not limited to, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Each tile typically includes programmable interconnect circuitry and programmable logic circuitry. The programmable interconnect circuitry typically includes a large number of interconnect lines (e.g., wires) of varying lengths.

Referring again to FIG. 2, net 235 traverses through a plurality of tiles (not shown). For purposes of illustration, each horizontal segment of net 235 may be referred to as a wire and is located within a tile. The term "node," as used herein, refers to a data structure representing a wire of a tile of an IC. Within this disclosure, the term node may be used interchangeably with the term wire from time-to-time. In some cases, reference to a particular node or wire further references the particular tile in which that node or wire is located. Thus, net 235 may be represented as a set of nodes (wires) used to route net 235.

Subsequent to routing, system 100 is capable of selecting a node of net 235 as the partition pin. In the example of FIG. 2, the partition pin refers to the wire used as a fixed logical and physical interface between reconfigurable partition 230 (e.g., and any reconfigurable modules implemented therein) and static circuitry 225 for dynamic partial reconfiguration within IC 200. For purposes of description, the partition pin may also be referred to as a "Steiner node" since the partition pin represents a connection point between two different portions of a net. Referring to FIG. 2, for example, the partition pin represents a connection point between a first portion of net 235 that is within reconfigurable module 230 and a second portion of net 235 that is within static circuitry 225 (e.g., external to reconfigurable module 230). For purposes of discussion, the partition pin effectively separates net 235 into two sub-nets.

Since the logical and physical interface to a given reconfigurable module remains constant despite the changing circuitry that is implemented over time, one can see that the particular node selected as the partition pin can significantly influence the QOR achieved for the IC. Selection of a suitable node or nodes as the partition pins can have a significant impact upon routing and, as such, timing of the circuit design as implemented within the IC. While the endpoint 245 remains unchanged (including the location), the location of the other end of net 235 when reconfigurable module 220 is implemented within reconfigurable region 230 may change.

Figures 3, 4:
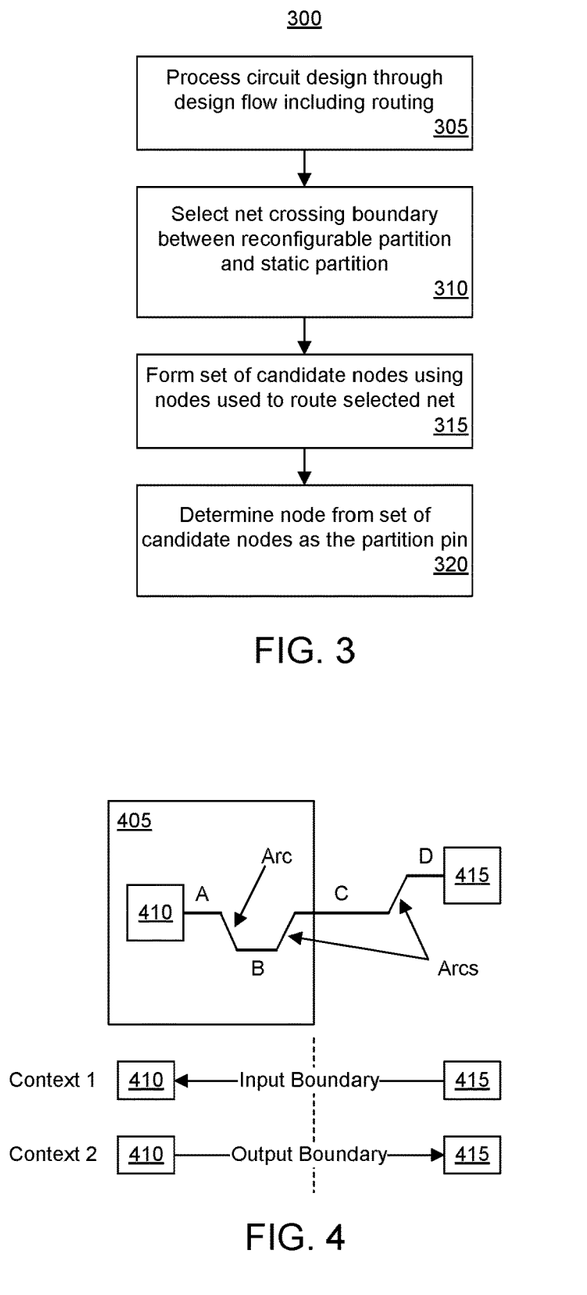
FIG. 3 illustrates an example method of implementing a circuit design having a reconfigurable partition.
FIG. 4 illustrates example criteria used to remove nodes from the set of candidate nodes for purposes of selecting a node as a partition pin.

FIG. 3 illustrates an example method 300 of implementing a circuit design having a reconfigurable partition. Method 300 may be performed by a system the same as or similar to the system described in connection with FIG. 1.

Method 300 can begin in block 305 where the system processes the circuit design through a design flow including routing. Implementing a circuit design within an IC, whether a programmable IC or an application specific IC (ASIC), entails processing the circuit design through the design flow. The design flow includes multiple, different phases. These phases generally include synthesis, placement, and routing.

Synthesis refers to the process of converting, or translating, an abstract, programmatic description of a circuit into a low-level design implementation. The abstract, programmatic description of the circuit describes behavior of the circuit and is also referred to as a "behavioral description" or a "register transfer level (RTL) description" of the circuit. The behavioral description is often specified using an HDL. The low-level design implementation generated through synthesis typically is specified as inter-connected logic gates.

Synthesis may also include mapping. Mapping is the process of correlating, or matching, the logic gates of the low-level circuit design to the various types of physical circuit blocks that are actually available in the particular IC in which the circuit design is to be implemented, i.e., the "target IC." For example, since a lookup table (LUT) may implement a complex function, one or more logic gates of the low-level design implementation may be mapped to a single LUT, or other programmable tile of the target IC. The mapped circuit design specifies the same functionality as the low-level design implementation, albeit in terms of the particular circuit blocks available on the target IC as opposed to low-level logic gates.

Placement is the process of assigning elements of the synthesized circuit design to particular instances of circuit blocks and/or resources having specific locations on the target IC. Once placed, a circuit element of the circuit design has a specific location on the target IC as opposed to only being assigned to a particular type of circuit block and/or resource as is the case after mapping and prior to placement. The location of a circuit element of a circuit design, once placed, is the location on the target IC of the instance of the circuit block and/or resource to which the circuit element is assigned. Routing is the process of selecting particular routing resources such as wires, programmable interconnection points (PIPs), PIP settings, and/or other interconnect circuitry to electrically couple the various circuit blocks of the target IC after placement.

In block 310, the system selects a routed net crossing a boundary between the reconfigurable partition of the circuit design and the static partition of the circuit design. An example of a routed net crossing a boundary as described is a routed net of the circuit design having a driver located in the reconfigurable partition (static partition) and a load located in the static partition (reconfigurable partition). Accordingly, the system is capable of identifying such a net of the routed circuit design and selecting the net for further processing.

For purposes of illustration, the processing of a single net is described. It should be appreciated, however, that a circuit design with a reconfigurable partition may include more than a single net crossing the boundary between reconfigurable partition and the static circuitry. As such, the operations described within this disclosure relating to selection of a partition pin would be performed for each such net in order to create an interface for the reconfigurable partition to implement the circuit design within an IC.

In block 315, the system forms a set of candidate nodes. The set of candidate nodes, for purposes of selecting a partition pin for the net, is, at least initially, each node used to route the selected net. In block 320, the system determines a node from the set of candidate nodes to be the partition pin. In one or more embodiments, the system applies different criteria to the set of candidate nodes to determine a node (from the set of candidate nodes) as the partition pin for partial reconfiguration.

For example, the system is capable of removing, e.g., excluding, one or more nodes from the set of candidate nodes that do not meet certain criteria. Once removed from the set of candidate nodes, the removed, or excluded, nodes are no longer considered for use as the partition pin. Having reduced the set of candidate nodes by removing one or more nodes, the system is further capable of selecting a node from the remaining nodes of the set of candidate nodes. The selected node is designated and used as the partition pin for the reconfigurable partition.

Referring to FIG. 2, for example, the system ensures that any portion of a net of a reconfigurable module that is supposed to connect to endpoint 245 flows through, e.g., is routed through, the partition pin. For each other reconfigurable module to be implemented within the reconfigurable region, the system routes the reconfigurable module so that the source (driver) of such a net that couples to endpoint 245 connects to the partition pin. Thus, from the partition pin to the endpoint of the net in the static circuitry (e.g., endpoint 245), that portion of the net is considered static and remains unchanged throughout partial reconfiguration. The portion of the net within the reconfigurable region (excluding the partition pin) changes with the particular reconfigurable module implemented therein. Use of the partition pin ensures a consistent and fixed logical and physical cross-boundary signal connection between the reconfigurable region of the IC and the static circuitry of the IC.

Figure 5:
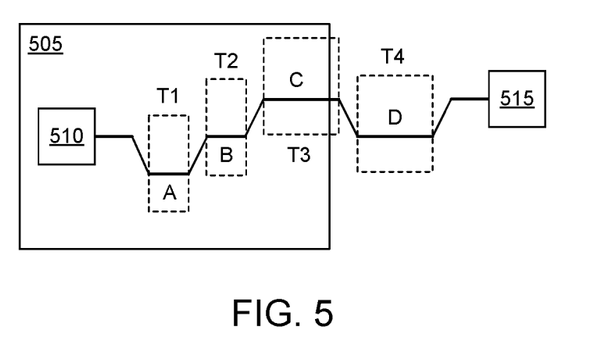
FIG. 5 illustrates example criteria used to select a node as a partition pin.

FIGS. 4 and 5 illustrate different criteria applied by the system for purposes of selecting a partition pin. For example, FIGS. 4 and 5 each illustrate criteria applied in block 320 of FIG. 3.

FIG. 4 illustrates example criteria used to filter or remove nodes from the set of candidate nodes for purposes of selecting a node as a partition pin. The examples illustrated in connection with FIG. 4 may be referred to herein as "exclusionary criteria" since the system applies the criteria to remove nodes from the set of candidate nodes.

As pictured, FIG. 4 illustrates a reconfigurable region 405. Reconfigurable region 405 includes a net that is formed of a plurality of different nodes (wires) labeled A, B, C, and D. Each of nodes A, B, C, and D may be referred to as a routing node since the nodes are used to route the net pictured in FIG. 4. The net crosses the boundary between reconfigurable region 405 having a reconfigurable module implemented therein (e.g., corresponding to the reconfigurable partition of the circuit design) and the static circuitry (e.g., corresponding to the static partition of the circuit design) external thereto. The net has an endpoint 410 located within reconfigurable region 405 and an endpoint 415 located in static circuitry external to reconfigurable region 405.

In one or more of the examples described below, the particular exclusionary criterion applied is contextually dependent upon the logical net connection, e.g., the direction of the net as depicted in contexts 1 and 2. For example, a criterion may be applied in one manner for context 1 where endpoint 415 is the driver in static circuitry and endpoint 410 is the load within the reconfigurable module, and in a different manner for context 2 where endpoint 410 is the driver in the reconfigurable module and endpoint 415 is the load in static circuitry. In the case of context 1, the net is an input boundary net, e.g., a net of an input port. In the case of context 2, the net is an output boundary net, e.g., a net of an output port.

A first example exclusionary criterion for use in removing nodes from the set of candidate nodes is that a node selected as a partition pin cannot be a site-pin node. Site-pin nodes are nodes that are directly coupled to an endpoint of the net for which a partition pin is being determined. The system applies the first example exclusionary criterion differently based upon the context. In the case of context 1, the partition pin may not be a load site-pin when the load is placed. For example, node A is a site-pin for the load (endpoint 410) in context 1. Accordingly, in the case of context 1, the system removes or excludes node A from the set of candidate nodes since using the load site-pin as the partition pin would limit the routing options within reconfigurable region 405. In the case of context 2, the partition pin may not be a driver site-pin when the driver is placed. For example, node A, in context 2, is site-pin of the driver (endpoint 410). Accordingly, in the case of context 2, the system removes or excludes node A from the set of candidate nodes since using the driver site-pin as the partition pin would limit the routing options within reconfigurable region 405. Thus, the system is capable of removing those nodes from the set of candidate nodes that are site-pin nodes for the two different contexts described.

A second example exclusionary criterion for use in removing nodes from the set of candidate nodes is that a node selected as a partition pin must have an arc on each end. For example, a node selected as a partition pin must have an arc on the input port and an arc on the output port (e.g., each end of the node). In FIG. 4, arcs are represented as the diagonal lines that link nodes A, B, C, and D. In an aspect, arcs may represent routing and/or interconnect resources of the IC that connect wires of different tiles. For example, arcs may represent PIPs in an IC having an array of tiles formed of programmable circuitry. Thus, node A and node D are excluded from the set of candidate nodes since node A is lacking an input port arc (output port arc) and node D is lacking an output port arc (input port arc) when viewed as an output net (input net).

A third example exclusionary criterion for use in removing nodes from the set of candidate nodes is that a node selected as a partition pin cannot have all input nodes or all output nodes be site-pin nodes. The third example exclusionary criterion is another case that is context dependent. The system removes or excludes each node that does not comply with the third example exclusionary criterion. The system applies the third example exclusionary criterion differently based upon whether the net is an input net or an output net.

In the case of context 1, when the net is an input net, the output nodes of a partition pin may not all be site-pins. For purposes of illustration, when considering output nodes of a given pin in the case of context 1, the output nodes are those nodes that couple to the left end of the node being considered as the partition pin. Thus, in the case of context 1, the node selected as the partition pin may not be connected to only site-pin nodes within reconfigurable region 405. The system, for example, removes or excludes node B from the set of candidate nodes since node B is only connected to the site-pin node A on the output side.

In the case of context 2, when the net is an output net, the input nodes of a partition pin may not all be site-pins. For purposes of illustration, when considering output nodes of a given pin in the case of context 2, the input nodes are those nodes that couple to the left end of the node being considered as the partition pin. Thus, in the case of context 2, the node selected as the partition pin may not be connected to only site-pin nodes within reconfigurable region 405. The system, for example, removes or excludes node B from the set of candidate nodes since node B is only connected to site-pin node A on the input side.

A fourth example exclusionary criterion for use in removing nodes from the set of candidate nodes is that each of the nodes for the net between a node selected as the partition pin and the source (or load) within the reconfigurable module must be contained within a routing containment area for the reconfigurable module. Referring to FIG. 4, the routing containment area for reconfigurable region 405 is represented by the edges of the rectangle labeled 405. Selecting either node B or node C results in each node between the selected node and endpoint 410 being located within the containment area for reconfigurable region 405.

A fifth example exclusionary criterion for use in removing nodes from the set of candidate nodes is that a node selected as a partition pin must be of a particular type of routing resource or wire. For example, the system may check a type attribute for each node within the set of candidate nodes and remove each node of a particular type that is unsuited to be a partition pin. As an illustrative and non-limiting example, the system is capable of identifying any nodes of the type "GNODE" and removing such nodes from the set of candidate notes.

Having filtered the set of candidate nodes using one or more or all of the aforementioned criteria, the system is capable of selecting a node from the remaining nodes in the set of candidate nodes as the partition pin.

FIG. 5 illustrates example criteria used to select a node as a partition pin. For example, FIG. 5 illustrates one or more of the criteria used to select a node as the partition pin from the remaining nodes of the set of candidate nodes after applying the example exclusionary criteria described with reference to FIG. 4. The examples illustrated in connection with FIG. 5 may be referred to herein as "selection criteria" since the system applies the criteria to select a node as the partition pin from the set of remaining nodes of the set of candidate nodes.

FIG. 5 illustrates a reconfigurable region 505 having a reconfigurable module implemented therein. For example, reconfigurable module 215 may be implemented therein. A net has an endpoint 510 located within reconfigurable region 505 and an endpoint 515 located in static circuitry external to reconfigurable region 505. In the example of FIG. 5, the net is routed using nodes A, B, C, and D. Thus, each of nodes A, B, C, and D is a routing node and is within the set of candidate nodes after applying the example exclusionary criteria described herein. Node A is part of, or located in, tile T1. Node B is part of, or located in, tile T2. Node C is part of, or located in, tile T3. Node D is part of, or located in, tile T4.

A first example selection criterion applied by the system to select a node is selecting the node that is closest to the endpoint (e.g., driver or load) in the static circuitry. For example, the system is capable of selecting the node closest to the site-pin node of endpoint 515. Thus, in the example of FIG. 5, the system selects node D of Tile T4 as the partition pin. Selecting the node closest to the site-pin node of endpoint 515 provides the router with a greater likelihood of meeting timing for routing further implementations of different reconfigurable modules to be implemented within reconfigurable region. For example, selection of node D provides the router with greater flexibility when routing reconfigurable module 220 for implementation within reconfigurable region 505.

A second example selection criterion applied by the system to select a node is selecting the node within the tile having the least number of Steiner nodes (e.g., partition pins) assigned thereto. By selecting the tile with the fewest partition pins, the likelihood of the router encountering congestion when routing further reconfigurable modules for implementation within reconfigurable region 505 is reduced. It should be appreciated that since the net is routed, selecting a particular tile selects the node within that tile as the partition pin.

As an illustrative example, consider a case where the system, in selecting a partition pin for the net illustrated in FIG. 5 has applied the exclusionary criteria described above and is left with nodes A, B, C, and D with the set of candidate nodes. If, for example, each of tiles T1, T2, T3, and T4 has a same number of partition pins, the system selects node D as the partition pin since node D is the closest node to the site-pin of endpoint 515. If, for example, tile T1 has 3 partition pins, tile T2 has 5 partition pins, tile T3 has 1 partition pin, and tile T4 has 2 partition pins, the system selects node C as the partition pin since tile 3 includes the least number of partition pins.

In an embodiment, the system is capable of applying the first or the second selection criterion based the type of the routing node that is used. For purposes of illustration and not limitation, for routing node types of NODE_SINGLE, NODE_DOUBLE, NODE_HLONG, and NODE_QUARD, the system uses the first selection criterion. For routing node types of NODE_LOCAL, the system uses the second selection criterion. Thus, the system is capable of using both selection criteria for selecting partition pins of a given reconfigurable partition based upon the particular type of routing node that is used. It should be appreciated that the particular types of routing nodes mentioned within this disclosure are for purposes of illustration only. The particular name of a routing node may vary from one IC architecture and/or manufacturer to another. In any case, the system is capable of applying one selection criterion or another based upon the type of routing nodes being considered.

Figure 6:
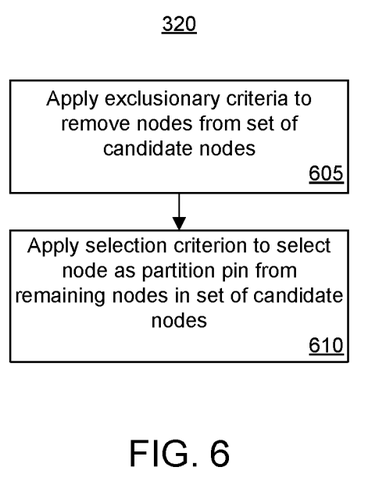
FIG. 6 illustrates an example method of determining a node as a partition pin.

FIG. 6 illustrates an example method of determining a node from a set of candidate nodes to be the partition pin. FIG. 6 illustrates an example implementation of block 320 of FIG. 3 as performed by a system the same as or similar to the system described in connection with FIG. 1. For example, FIG. 6 illustrates application of criteria, by the system, to select a node from the set of candidate nodes as the partition pin.

In block 605, the system applies one or more of the exclusionary criteria to the set of candidate nodes. In an aspect, the system is capable of applying each of the first, second, third, fourth, and fifth exclusionary criteria described in connection with FIG. 4 to the set of candidate nodes. The system is capable of filtering the set of candidate nodes using the exclusionary criteria. As such, the system is capable of removing those nodes from the set of candidate nodes that are non-compliant with the exclusionary criteria.

In block 610, the system applies a selection criterion to select a node as a partition pin from the set of nodes remaining in the set of candidate nodes. In an aspect, the system is capable of applying the first selection criterion or the second selection criterion as described in connection with FIG. 5. As discussed, in an embodiment, the system determines the type of each node remaining within the set of candidate nodes. Based upon the type, the system selects either the first selection criterion or the second selection criterion.

As discussed, having selected a partition pin or a partition pin for each net that crosses the boundary of the reconfigurable partition, the system is capable of routing any remaining reconfigurable modules for the reconfigurable partition using the selected partition pins as fixed logical and physical interfaces. The resulting circuit design may then be loaded into an IC thereby physically implementing the circuit design within the IC. During operations, partial bitstreams may be loaded into the IC to effectuate partial reconfiguration using the partition pins as interfaces for the various reconfigurable modules implemented within the IC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the term "output" means storing in physical memory elements, e.g., devices, writing to display or other peripheral output device, sending or transmitting to another system, exporting, or the like. As defined herein, the term "plurality" means two or more than two.

As defined herein, the terms "one embodiment," "an embodiment," "one or more embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to methods of implementing a circuit design for partial reconfiguration. In one aspect, a method can include routing, using a processor, a net of the circuit design that connects an endpoint within a reconfigurable module with an endpoint within static circuitry external to the reconfigurable module, forming, using the processor, a set of candidate nodes including nodes used to route the net, and determining, using the processor, a node from the set of candidate nodes as a partition pin for partial reconfiguration.

In an aspect, determining the node includes removing a selected node from the set of candidate nodes based upon exclusionary criteria. Determining the node can also include selecting the node as the partition pin using a selection criterion determined from a plurality of selection criteria based upon type of nodes within the set of candidate nodes.

In another aspect, determining the node includes removing a selected node from the set of candidate nodes that lacks an input port or lacks an output port coupled to an arc.

In another aspect, determining the node includes removing a selected node from the set of candidate nodes that has all output nodes that are site-pin nodes within the reconfigurable module when the net is an input net, or removing a selected node from the set of candidate nodes that has all input nodes that are site-pin nodes within the reconfigurable module when the net is an output net.

In another aspect, determining the node includes removing a selected node from the set of candidate nodes that, if used as a partition pin, results in a node of the net between the partition pin and the endpoint of the net within the reconfigurable module being located outside a routing containment area for the reconfigurable module.

In another aspect, determining the node includes removing a selected node from the set of candidate nodes that is a site-pin node of the endpoint within the reconfigurable module.

In another aspect, the node determined as the partition pin is closest to the endpoint of the net located within the static circuitry.

In another aspect, the node determined as the partition pin is within a tile having fewest partition pins.

One or more embodiments are directed to systems for implementing a circuit design for partial reconfiguration. In one aspect, a system includes a processor configured to initiate executable operations. The executable operations include routing a net of the circuit design that connects an endpoint within a reconfigurable module with an endpoint within static circuitry external to the reconfigurable module, forming a set of candidate nodes including nodes used to route the net, and determining a node from the set of candidate nodes as a partition pin for partial reconfiguration.

In an aspect, determining the node includes removing a selected node from the set of candidate nodes based upon exclusionary criteria. Determining the node can also include selecting the node as the partition pin using a selection criterion determined from a plurality of selection criteria based upon type of nodes within the set of candidate nodes.

In another aspect, determining the node includes removing a selected node from the set of candidate nodes that lacks an input port or lacks an output port coupled to an arc.

In another aspect, determining the node includes removing a selected node from the set of candidate nodes that has all output nodes that are site-pin nodes within the reconfigurable module when the net is an input net, or removing a selected node from the set of candidate nodes that has all input nodes that are site-pin nodes within the reconfigurable module when the net is an output net.

In another aspect, determining the node includes removing a selected node from the set of candidate nodes that, if used as a partition pin, results in a node of the net between the partition pin and the endpoint of the net within the reconfigurable module being located outside a routing containment area for the reconfigurable module.

In another aspect, determining the node includes removing a selected node from the set of candidate nodes that is a site-pin node of the endpoint within the reconfigurable module.

In another aspect, the node determined as the partition pin is closest to the endpoint of the net located within the static circuitry.

In another aspect, the node determined as the partition pin is within a tile having fewest partition pins.

One or more embodiments are directed to computer program products for implementing a circuit design for partial reconfiguration. In one aspect, a computer program product includes a computer readable storage medium having program code stored thereon. The program code is executable by a processor to perform operations including routing, using the processor, a net of the circuit design that connects an endpoint within a reconfigurable module with an endpoint within static circuitry external to the reconfigurable module, forming, using the processor, a set of candidate nodes including nodes used to route the net, and determining, using the processor, a node from the set of candidate nodes as a partition pin for partial reconfiguration.

In an aspect, determining the node includes removing a selected node from the set of candidate nodes based upon exclusionary criteria and selecting the node as the partition pin using a selection criterion determined from a plurality of selection criteria based upon type of nodes within the set of candidate nodes.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of implementing a circuit design for partial reconfiguration, comprising:
    routing, using a processor, a net of the circuit design that connects an endpoint within a reconfigurable partition with an endpoint within static circuitry external to the reconfigurable partition;
    forming, using the processor, a set of candidate nodes, wherein the set of candidate nodes correspond to wires of tiles of programmable circuitry used to route the net in an integrated circuit; and
    determining, using the processor, a node from the set of candidate nodes as a partition pin, wherein the partition pin is a fixed interface used during partial reconfiguration of the integrated circuit between the static circuitry and the reconfigurable partition;
    wherein the determining the node includes removing each node from the set of candidate nodes that lacks an input port or lacks an output port coupled to an arc, wherein arcs are routing resources of the integrated circuit that connect wires of different tiles.

2. The method of claim 1, wherein the determining the node comprises:
    removing a selected node from the set of candidate nodes based upon exclusionary criteria.

3. The method of claim 2, wherein the determining the node comprises:
    selecting the node as the partition pin using a selection criterion determined from a plurality of selection criteria based upon type of nodes within the set of candidate nodes.

4. The method of claim 1, wherein the determining the node comprises:
    removing a selected node from the set of candidate nodes that has all output nodes that are site-pin nodes within the reconfigurable module when the net is an input net; or
    removing a selected node from the set of candidate nodes that has all input nodes that are site-pin nodes within the reconfigurable module when the net is an output net.

5. The method of claim 1, wherein the determining the node comprises:
    removing a selected node from the set of candidate nodes that, if used as a partition pin, results in a node of the net between the partition pin and the endpoint of the net within the reconfigurable module being located outside a routing containment area for the reconfigurable module.

6. The method of claim 1, wherein the determining the node comprises:
  removing a selected node from the set of candidate nodes that is a site-pin node of the endpoint within the reconfigurable module.

7. The method of claim 1, wherein the node determined as the partition pin is closest to the endpoint of the net located within the static circuitry.

8. The method of claim 1, wherein the node determined as the partition pin is within a tile having fewest partition pins.

9. A system for implementing a circuit design for partial reconfiguration, the system comprising:
  a processor configured to initiate executable operations including:
    routing a net of the circuit design that connects an endpoint within a reconfigurable partition with an endpoint within static circuitry external to the reconfigurable partition;
    forming a set of candidate nodes, wherein the set of candidate nodes correspond to wires of tiles of programmable circuitry used to route the net in an integrated circuit; and
    determining a node from the set of candidate nodes as a partition pin, wherein the partition pin is a fixed interface used during partial reconfiguration of the integrated circuit between the static circuitry and the reconfigurable partition;
    wherein the determining the node includes removing each node from the set of candidate nodes that lacks an input port or lacks an output port coupled to an arc, wherein arcs are routing resources of the integrated circuit that connect wires of different tiles.

10. The system of claim 9, wherein the determining the node comprises:
  removing a selected node from the set of candidate nodes based upon exclusionary criteria.

11. The system of claim 10, wherein the determining the node comprises:
  selecting the node as the partition pin using a selection criterion determined from a plurality of selection criteria based upon type of nodes within the set of candidate nodes.

12. The system of claim 9, wherein the determining the node comprises:
  removing a selected node from the set of candidate nodes that has all output nodes that are site-pin nodes within the reconfigurable module when the net is an input net; or
  removing a selected node from the set of candidate nodes that has all input nodes that are site-pin nodes within the reconfigurable module when the net is an output net.

13. The system of claim 9, wherein the determining the node comprises:
  removing a selected node from the set of candidate nodes that, if used as a partition pin, results in a node of the net between the partition pin and the endpoint of the net within the reconfigurable module being located outside a routing containment area for the reconfigurable module.

14. The system of claim 9, wherein the determining the node comprises:
  removing a selected node from the set of candidate nodes that is a site-pin node of the endpoint within the reconfigurable module.

15. The system of claim 9, wherein the node determined as the partition pin is closest to the endpoint of the net located within the static circuitry.

16. The system of claim 9, wherein the node determined as the partition pin is within a tile having fewest partition pins.

17. A computer program product comprising a computer readable storage medium having program code stored thereon, the program code executable by a processor to perform operations for implementing a circuit design for partial reconfiguration, the operations comprising:
  routing, using the processor, a net of the circuit design that connects an endpoint within a reconfigurable partition with an endpoint within static circuitry external to the reconfigurable partition;
  forming, using the processor, a set of candidate nodes, wherein the set of candidate nodes correspond to wires of tiles of programmable circuitry used to route the net in an integrated circuit; and
  determining, using the processor, a node from the set of candidate nodes as a partition pin, wherein the partition pin is a fixed interface used during partial reconfiguration of the integrated circuit between the static circuitry and the reconfigurable partition;
  wherein the determining the node includes removing each node from the set of candidate nodes that lacks an input port or lacks an output port coupled to an arc, wherein arcs are routing resources of the integrated circuit that connect wires of different tiles.

18. The computer program product of claim 17, wherein the determining the node comprises:
  removing a selected node from the set of candidate nodes based upon exclusionary criteria; and
  selecting the node as the partition pin using a selection criterion determined from a plurality of selection criteria based upon type of nodes within the set of candidate nodes.

* * * * *